(12) United States Patent
Meliga et al.

(10) Patent No.: US 7,424,041 B2
(45) Date of Patent: Sep. 9, 2008

(54) WIDE TUNEABLE LASER SOURCES

(75) Inventors: Marina Meliga, Turin (IT); Alessandro Stano, Turin (IT); Paul Marshall Charles, Ipswich (GB); Claudio Coriasso, Turin (IT); Roberto Paoletti, Turin (IT); Michele Agresti, Turin (IT); Marco Vallone, Turin (IT)

(73) Assignee: Avago Technologies Fiber IP Pte Ltd., Singapore (SG)

( * ) Notice: Subject to any disclaimer, the term of this patent is extended or adjusted under 35 U.S.C. 154(b) by 232 days.

(21) Appl. No.: 10/835,080

(22) Filed: Apr. 29, 2004

(65) Prior Publication Data

US 2005/0244994 A1     Nov. 3, 2005

(51) Int. Cl.
*H01S 3/10*     (2006.01)
*H01S 5/00*     (2006.01)

(52) U.S. Cl. ............................... 372/20; 372/50.11

(58) Field of Classification Search ............ 372/20, 372/50.121

See application file for complete search history.

(56) References Cited

U.S. PATENT DOCUMENTS

| 5,394,489 | A | 2/1995 | Koch | 385/14 |
|---|---|---|---|---|
| 6,275,317 | B1* | 8/2001 | Doerr et al. | 398/201 |
| 6,714,566 | B1* | 3/2004 | Coldren et al. | 372/20 |
| 7,130,499 | B2* | 10/2006 | Grubb et al. | 385/14 |
| 2003/0081878 | A1* | 5/2003 | Joyner et al. | 385/14 |
| 2003/0185256 | A1* | 10/2003 | Aoki | 372/20 |
| 2004/0067006 | A1* | 4/2004 | Welch et al. | 385/14 |
| 2004/0174915 | A1* | 9/2004 | Sarlet et al. | 372/20 |
| 2005/0243874 | A1* | 11/2005 | Paoletti et al. | 372/20 |

OTHER PUBLICATIONS

U. Koren et al., Wavelength division multiplexing light source with integrated quantum well tunable lasers and optical amplifiers, May 22, 1989, Applied Physics Letters, p. 2056-2058.

* cited by examiner

*Primary Examiner*—Minsun Harvey
*Assistant Examiner*—Phillip Nguyen

(57) ABSTRACT

A method of manufacturing a tuneable laser assembly including a substrate having formed thereon a plurality of tuneable lasers including Multi Quantum Well (MQW) active sections as well as distributed Bragg reflector (DBR) tuning sections. The lasers have respective emission wavelengths and tuning ranges such that the laser assembly can be tuned over a quasi-continuous predetermined wavelength range. The assembly also includes a plurality of passive waveguides coupled to the lasers to receive therefrom the respective emission wavelengths as well as an optical coupler coupled to the waveguides to receive via the waveguides the emissions wavelengths from the lasers. A Multi Quantum Well (MQW) amplifier coupled to the coupler amplifies the emission wavelengths coupled via the optical coupler. The method includes the steps of:

using the same Multi-Quantum Well material for the Multi Quantum Well (MQW) sections of the tuneable lasers as well as for the Multi Quantum Well (MQW) amplifier, and using a common bulk material for the passive waveguides, the optical coupler and the DBR tuning sections of the lasers.

37 Claims, 5 Drawing Sheets

WIDE TUNEABLE LASER SOURCES

FIELD OF THE INVENTION

The present invention concerns semiconductor laser sources, such as tuneable distributed Bragg reflector (DBR) laser sources.

These laser sources are tuneable over a wide wavelength range and suitable for use, for instance, in wavelength division multiplexed (WDM) systems and fixed wavelength communication systems.

DESCRIPTION OF THE RELATED ART

Tuneable laser sources provide significant advantages over the existing and widely diffused fixed wavelength lasers for DWDM (Dense Wavelength Division Multiplexing) systems application, both for metro and long haul transmission. In a short term perspective tuneable lasers can represent a cost effective solution for inventory problem while in the long term perspective they can add new functionalities to telecommunication networks directed at achieving effective wavelength routing.

U.S. Pat. No. 5,394,489 discloses a tuneable laser source that comprises several fixed wavelength distributed feedback (DFB) lasers disposed on a substrate. The lasers are linked via waveguides to an optical coupler, such as the Star coupler, followed by an amplifier and a modulator. Each laser is individually activated to emit a single wavelength. Thus, depending on the emission wavelength of each laser, the device is capable of emitting a series of discrete wavelengths.

Some tuning of the DFB laser may be possible by controlling the temperature of the lasers, however this is costly and will not provide a laser source that is capable of selectively emitting light covering a continuous range of wavelengths.

U. Koren, et al. in "Wavelength division multiplexing light source with integrated quantum well tuneable lasers and optical amplifiers", Appl. Phys. Lett. 54(21), 22 May 1989, pp. 2056-2058 disclose a photonic integrated circuit composed of three wavelength multiple quantum well tuneable lasers with a passive optical power combiner and an optical output amplifier. There, independent channel operation with 1-2 mW output power is demonstrated.

OBJECTS AND SUMMARY OF THE INVENTION

Despite the advancements described in the foregoing, some features of the laser sources still represent a big challenge for a widespread adoption of tuneable sources. Tuneable sources must be compact, truly reliable and have a low power consumption to be used in transponder/transceiver modules. They must be easy to control and the number of electrodes for addressing each wavelength must be maintained small. They should be capable of being tuned over wide tuning ranges (e.g. a 40 nm tuning range) and exhibit high optical power. Electronic control of the tuning mechanism is also the preferred solution for many applications.

An object of the invention is to produce an improved, fully integrated laser source, capable of being tuned over a wide range of continuous wavelengths, while retaining a simple structure adapted to be manufactured at low cost.

Such a laser source may have applications in WDM communications systems where several wavelengths are multiplexed and transmitted down a single fiber. Furthermore, such a tuneable laser source also has applications in single wavelength communication systems, where it is desirable from a manufacturing point of view to stock a single laser source, which can be used in a variety of optical modules. Depending on the customer's wavelength requirements, the tuneable laser source can be fitted into the module and the appropriate wavelength selected. This has the advantage of reducing inventory and enabling volume production of a single laser source for many types of optical modules.

A further object of the invention is to simplify manufacturing of such wide tuneable source, by minimizing the material compositions required for the active and passive waveguides of the complete structure, thus effectively reducing the number of monolithic integration steps involved in the manufacturing process.

A further object of the invention is to provide a more efficient source, typically in the form of a DBR array source, optimized for integration a monolithic integrated, fully electronically controlled wide tuneable source.

Such a source is particularly adapted for use in the C band and an/or the L band in WDM systems.

These and other objects are fulfilled by means of a tuneable laser assembly comprising a substrate having formed thereon a plurality of tuneable DBR lasers, a plurality of waveguides coupled to each of the lasers, an optical coupler coupled to the waveguides, and an amplifier coupled to the optical coupler. The lasers have peak emission wavelengths and tuning ranges such that the laser assembly can be tuned over a quasi-continuous predetermined wavelength range.

A particularly preferred embodiment of the invention provides for the waveguides, the optical coupler, and the amplifier being all integrally formed on the substrate. Preferably, this involves the production of a monolithic tunable laser source based on a selectable DBR array, integrated with a PIC (Planar Integrated Circuit), capable of routing the power to a MMI (Multi-Mode Interference) coupler and a SOA (Semiconductor Optical Amplifier). The device is very compact (e.g. 0.67 mm$^2$ chip size), and can be tuned, for instance, over 40 nm with 20 mW of output power ex-facet. It exhibits low power consumption (typically 250 mW) and only three electrodes must be electronically controlled to address each channel. Compared to other DFB selectable arrays, such a tuneable source is tuned only by injected currents and does not imply any thermal tuning. Electronic control of tuning is a clear asset in reducing switching times between the channels and obtaining a simpler tuning control and strategy.

BRIEF DESCRIPTION OF THE ENCLOSED REPRESENTATIONS

While the principal features and advantages of the present invention have been described above, a greater understanding and appreciation of the invention can be obtained from the following figures and detailed description of the preferred embodiment, in which.

DETAILED DESCRIPTION OF PREFERRED EMBODIMENTS OF THE INVENTION

Figure 1:
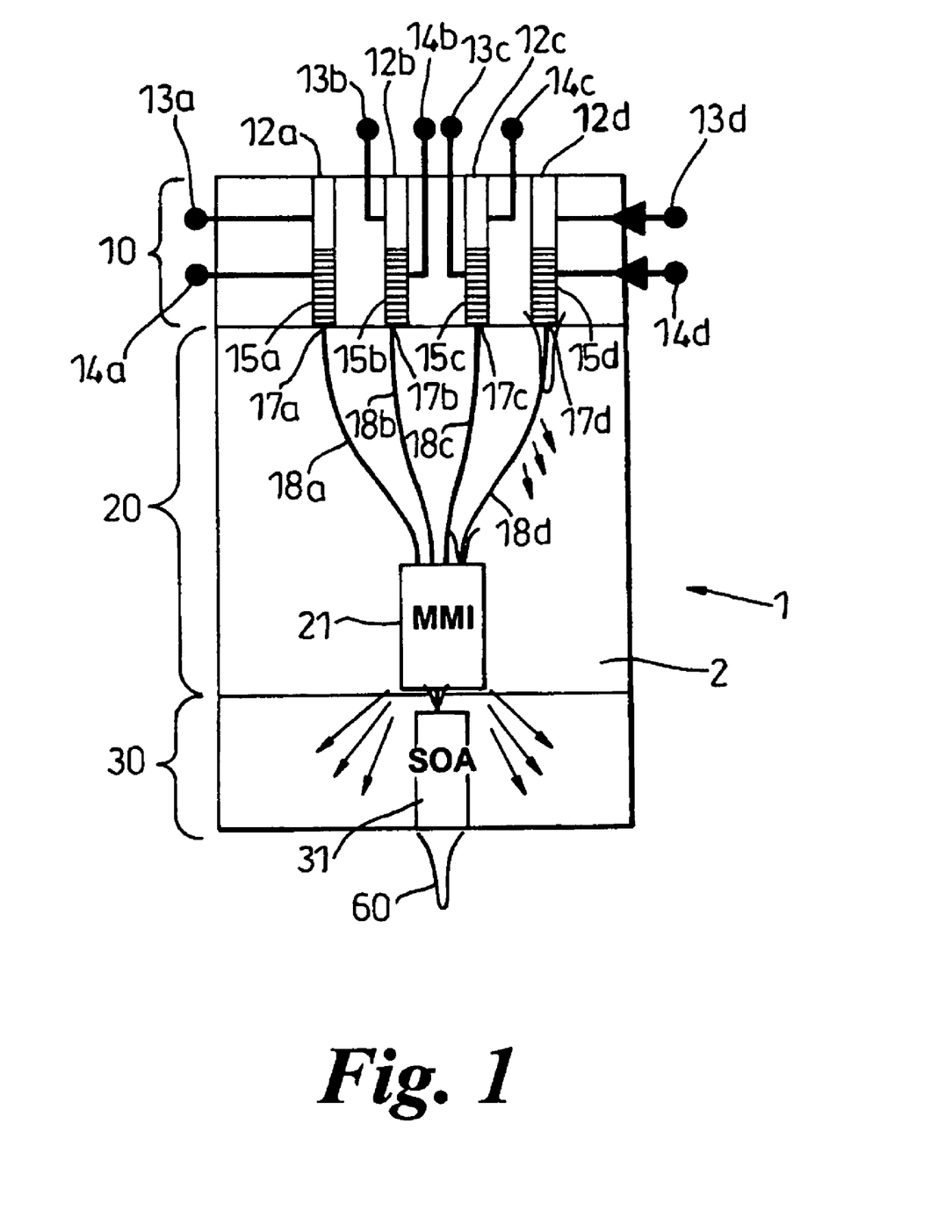
FIG. 1 shows a plane view of the principal features of the tuneable laser assembly.
Figure 2A:
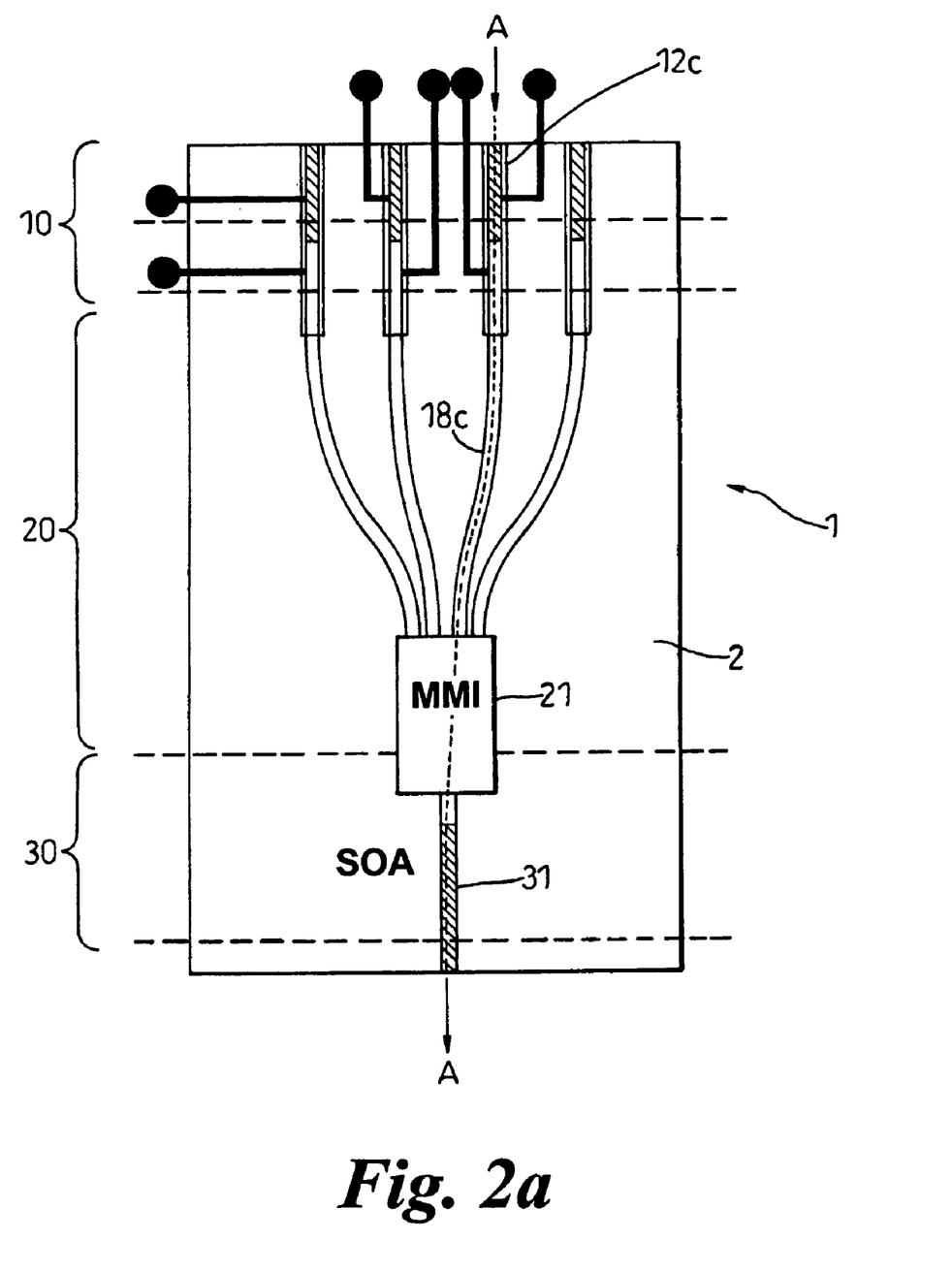
FIG. 2a shows a further plane view of the laser assembly.
Figure 2B:
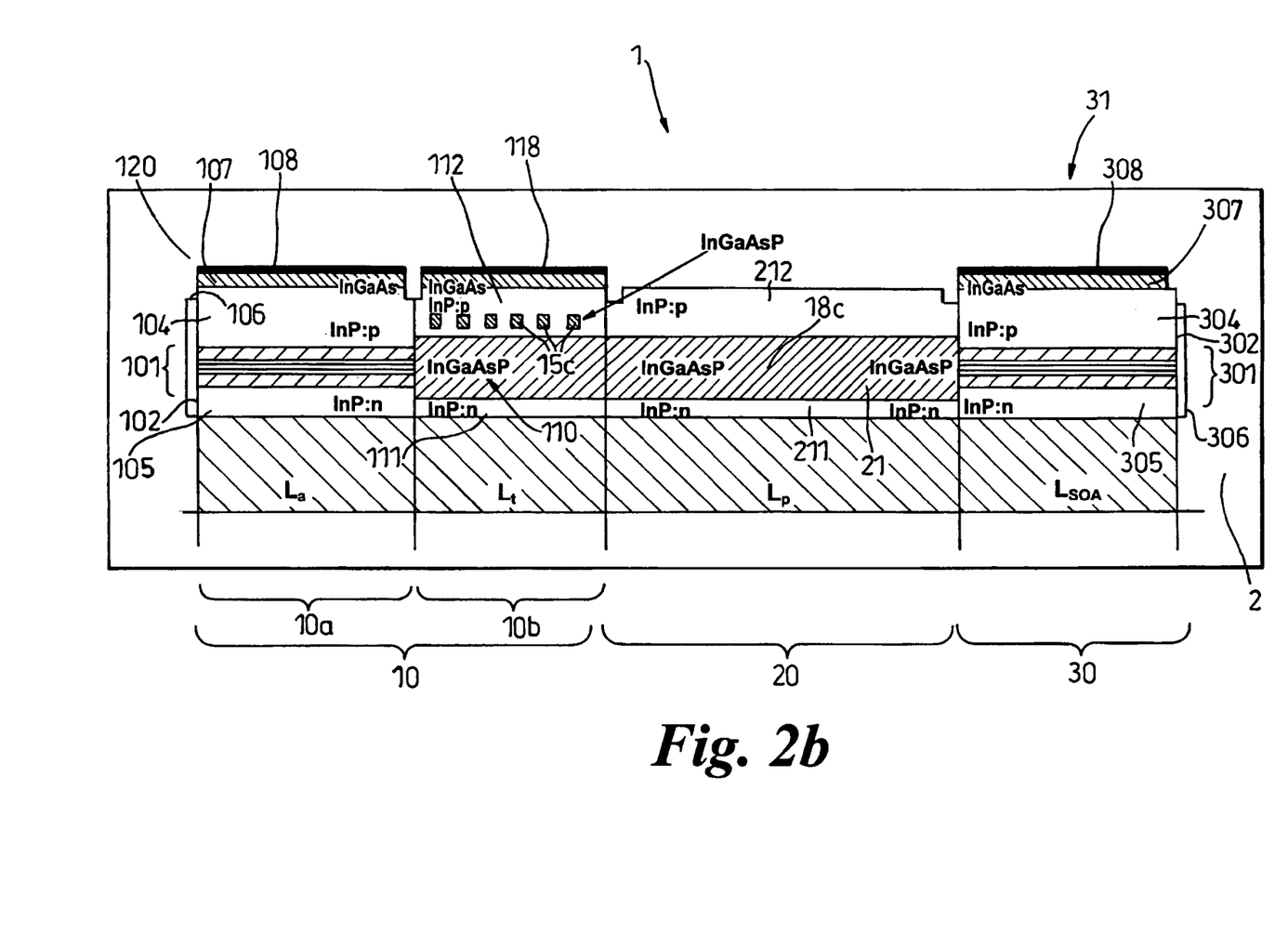
FIG. 2b shows a cross section of the laser assembly along the path labelled A-A in FIG. 2a, FIG. 3 shows a further embodiment of the present invention coupled to a modulator and an output fiber.

As seen in FIGS. 1, 2a and 2b, a laser assembly 1 can be divided into essentially three sections: a DBR laser 10, an optical coupler 20, and an optical amplifier 30, all of which are integrally formed on a single substrate 2.

The laser section 10 includes a plurality of individual DBR lasers 12a, 12b, 12c, 12d. Each DBR laser is individually activated, by injecting a current ($I_{laser}$) via electrical connections 13a, 13b, 13c and 13d, respectively. Each DBR laser includes a grating 15a, 15b, 15c and 15d, respectively, which is formed on the surfaces of the laser in a manor well know in the art. The tuning of each laser is achieved by injecting a further current ($I_{grating}$) to the gratings via further electrical connections 14a, 14b, 14c and 14d respectively. Thus it is possible to both individually activate each DBR laser and to tune each laser.

The laser section 10 has two parts, an active section 10a and a tuning section 10b. The active section is comprised of essentially a multiple quantum well layer 101 surrounded by upper 104 and lower 105 cladding layers. A cap layer 107 is located on top of the upper cladding layer followed by a metal contact layer 108. A high reflective coating 106 is deposited on the end face 102 of the laser section.

The tuning section 10b consists of essentially a waveguide layer 110 surrounded by upper 112 and lower 111 cladding regions having lower refractive indices than the waveguide layer. A grating structure 15c is formed and surrounded by the upper cladding layer. A metal contact layer 118 is deposited on top of the upper cladding layer.

The operation and tuning of DBR lasers is well known in the art and thus will not be described here in further detail. By appropriately selecting the peak emission wavelength of each laser device, it is possible to create a laser source, capable of being tuned over a quasi-continuous range of wavelengths. For example, the four DBR lasers 12a, 12b, 12c, and 12d may be chosen with Bragg wavelengths at zero tuning current of 1535 nm, 1545 nm, 1555 nm, and 1565 nm respectively, and each laser is capable of being tuned by −12 nm.

The resulting laser source has an effective wavelength range covering over 40 nm from 1523 nm to 1565 nm. This wavelength range more than covers the C band transmission spectrum, which is from 1530 nm to 1560 nm.

In may be advantageous to select individual DBR lasers with a peak emission wavelengths and tuning ranges so that there is a small overlap 33 with the peak emission wavelength of the adjacent laser(s).

As will be appreciated, the peak emission wavelength and tuneable range, as well as the number of individual laser devices, can be selected according to the wavelength range required for that particular laser source.

Now turning to section 20 of FIG. 1, the passive output end 17a, 17b, 17c, 17d of the individual DBR lasers is coupled to a waveguide 18a, 18b, 18c, 18d respectively. The waveguides are formed as an integral part of the substrate 2. Each waveguide is also coupled to an optical coupler 21. The optical coupler can be multimode interference (MMI) coupler, or alternatively, a Star coupler. The optical coupler functions to receive light emitted by the activated laser device and transmitted via its corresponding waveguide and transmit this light to semiconductor optical amplifier (SOA) 31.

As seen in FIG. 2b, section 20 consists of a waveguide layer 18c surrounded by an upper 212 and lower 211 cladding regions having lower refractive indices than the waveguide layer. The waveguide layer 18c may be the same material as the waveguide layer 110 in section 10b. The multimode interference coupler 21 is formed at the end of section 20 adjacent to section 30.

The SOA is disposed in the third section 30 of the laser assembly and is integrally formed in substrate 2. The SOA is comprised of essentially a multiple quantum well layer 301 surrounded by upper 304 and lower 305 cladding layers. A cap layer 307 is located on top of the upper cladding layer followed by metal contact layer 308. An anti-reflective coating 306 is deposited on the end face 302 of the SOA section. The SOA functions to recover, through amplification, all the optical losses that occur as the light propagated from the laser towards the output 60 of the laser source.

FIG. 2b is a cross section taken along the path labelled A-A in FIG. 2a, where those features shown also appearing in FIG. 1 have the same reference numbers. As can be clearly seen in FIG. 2b, all the components of the laser assembly are integrally formed on a single substrate 2. This is highly desirable from a manufacturing perspective and enables a compact, low cost tuneable laser source to be made.

Figure 3:
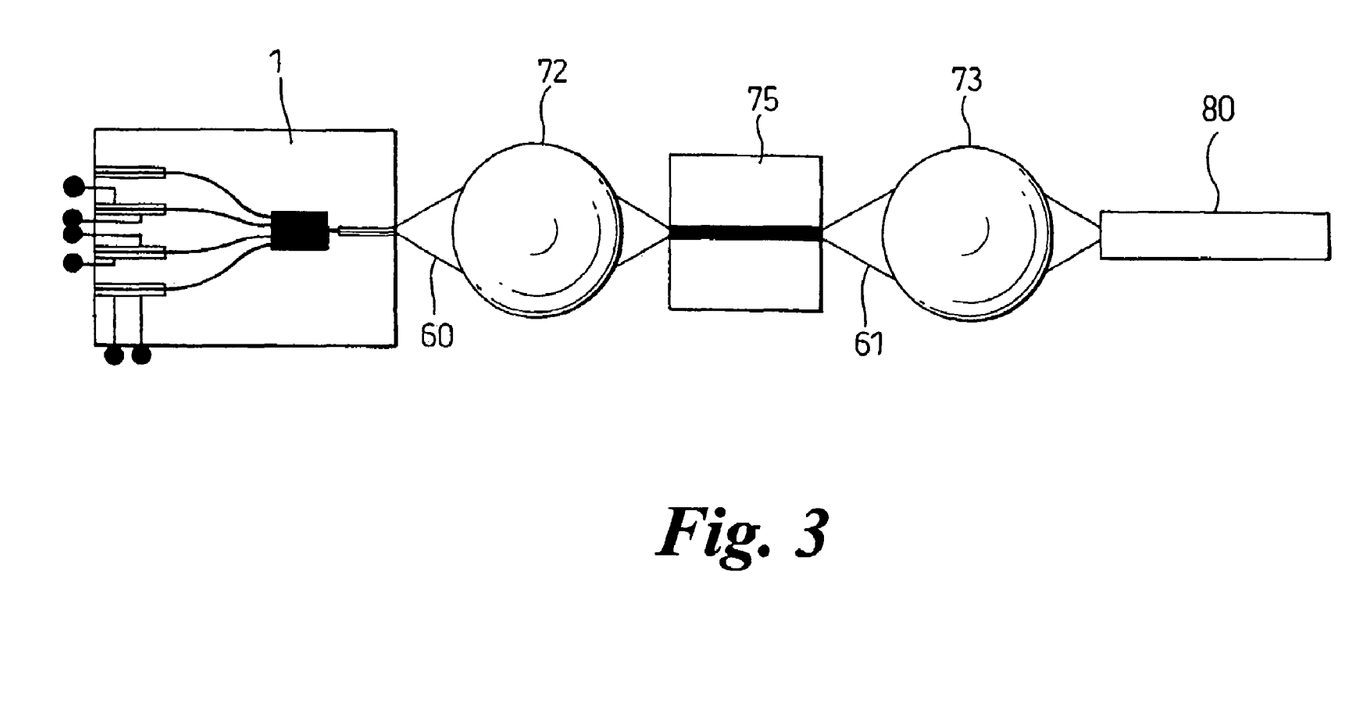

In FIG. 3 an arrangement is shown in which the output 60 of laser assembly 1 described above is coupled via ball lens 72 to external modulator 75. The output 61 of the modulator is coupled via a second ball lens 73 to output optical fiber 80. The operation of the modulator is well known. The arrangement in question demonstrates how the laser assembly just described can be used in a modulated communications network.

In a particularly preferred embodiment, the device consists of a DBR array including four DBR lasers 12a, 12b, 12c, and 12d capable of a 40 nm total tuning range, monolithically integrated to a PIC 2. The latter is capable of routing the power to the MMI combiner 21 and the SOA 31 recovering the internal losses and boosting the optical power up to 20 mW. The two-section DBR lasers 12a, 12b, 12c, and 12d have been designed to get high power, high extinction ratio and wide tuning range (>10 nm). Each grating section 15a, 15b, 15c, and 15d has been designed to get maximum power from its facet, high SMSR (>30 dB), acceptably low propagation losses, wide tuning (>10 nm).

The optical combiner 21 is a 4×1 MMI coupler having a length of about 130 um and a width of 15 um, balanced in 1 dB. The input ports of the MMI coupler 21 are connected to the four 40 um-spaced DBR lasers 12a, 12b, 12c, and 12d through single-mode bent waveguides. The SOA 31 has been designed to achieve a high saturation power over the C-band and to recover all the optical losses, together with a bent output waveguide, essential to reduce the AR requirements.

Preferably, the DBR array is fabricated on an InP substrate 2 using five regrowth steps on a MOCVD (Metallo Organic Chemical Vapor Deposition) reactor. The DBR active section and the SOA 31 are based on a Multi Quantum Well stack, made of nine InGaAsP wells (photoluminescence wavelength=1560 nm, +1% compressive strained, thickness=8 nm), ten barriers (photoluminescence wavelength=1270 nm, −0.5% tensile strained, thickness=8 nm) and two matched InGaAsP confinement regions (photoluminescence wavelength=1270 nm, unstrained, thickness=50 nm)

The passive quaternary waveguide, butt-joined to the active sections, is a InGaAsP bulk waveguide, the grating is etched in an other InGaAsP bulk layer separated by a InP spacer from the previous bulk waveguide layer.

The pitches for the four gratings 15a, 15b, 15c, and 15d have been written by Electron Beam Lithography and defined by RIE (Reactive Ion Etching). An InP:Fe blocking layer has been re-grown to define the Semi-Insulating Buried Heterostructure (SI-BH) surrounding the mesas. The last regrowth is responsible for the p doped InP cap and InGaAs contact layers.

Preferably, the chip is only 1670 um long and 400 um wide, thanks to the narrowly spaced (40 um) DBR waveguides. The device has been finally AR coated on the SOA output facet ($10^{-3}$ residual power reflectivity).

In the arrangement just described the same Multi-Quantum Well material is used for all the DBR sections as well as for the SOA 31. The same bulk material is used for the passive waveguides, the MMI coupler 21 and the DBR tuning sections 15a, 15b, 15c, and 15d.

In that way it is possible to decrease the number of the monolithic integration steps, reducing dramatically the device complexity. This involves optimizing the material compositions and the waveguide geometry, by achieving a good compromise between the losses in the passive waveguides and the refractive index variations (which is responsible for the tuning behavior) in the DBR tuning sections. Specifically, for the material composition, an equivalent wavelength of 1400-1420 nm can ensure up to 14 nm tuning range for each DBR, as well as 4 dB losses in the passive waveguides due to scattering and absorption, in addition to the 6 dB losses intrinsic to the MMI coupler 21. All these optical losses (to a total of 10 dB) are recovered by the SOA 31.

Figure 4:
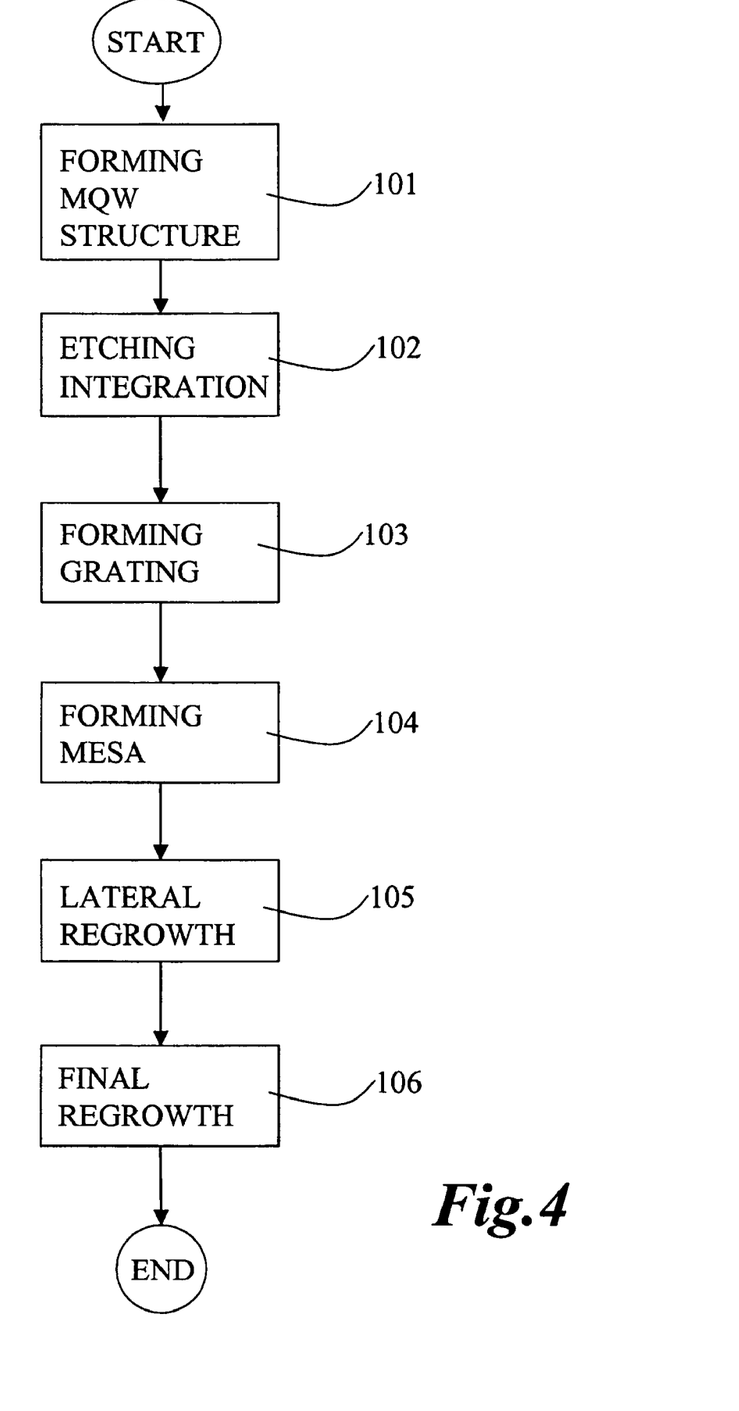
FIG. 4 is a diagram of the steps/phases of the manufacturing process of the assembly described herein.

In brief, the manufacturing process of the device described in the foregoing involves six basic steps or phases designated 101 to 106 in the diagram of FIG. 4.

As a first step 101 the MQW planar structure forming the gain (active) material of the DBR structures and the SOA is realized.

Then in the step 102 the active region is etched, and the integration is achieved between the active and the common passive material for the DBR tuning sections, the passive waveguides and the MMI coupler.

The gratings of the tuning sections and the mesa of the waveguides are realized in the steps 103 and 104, respectively. The blocking layer around the mesa is regrown via lateral regrowth in the step 105, and in the step 106 the layers on the top of the mesa are produced by means as a final regrowth operation.

Each and every processing step referred to in the foregoing is by itself well known to those of skill in the art, which makes it unnecessary to provide a corresponding detailed description herein.

It will be appreciated that tunable selectable arrays have been so far produced mostly by using DFB (Distributed Feed-Back) lasers as the source array. Conversely DBR have been mostly optimized in order to ensure high output power and wide tuning ranges, leading to long devices that use the active region as the output facet.

In order to monolithically integrate a DBR with a passive integrated circuit, to implement a wavelength selectable DBR array, the output power has to be coupled from the tuning section (usually a very low power section) instead of the active section, as usual. The arrangement described herein involves a DBR structure ideally adapted for monolith integration in a wide tuneable WDM laser source.

Specifically, the DBR has a short tuning section (150-200 um), thus reducing the transmission losses and increasing the power from the tuning section itself. The tuning section is the same optical waveguide that routes the light to the coupler so that the power coming out is routed to the passive integrated circuit without any additional losses due to scattering, coupling losses and the like.

Additionally, the grating strength (KL, L being the length of the tuning section and K being the coupling coefficient of the grating) is maintained as low as possible ($K=25$ cm$^{-1}$, KL less than 0.5) to reduce output reflectivity, hence increasing the external quantum efficiency from the tuning section output. In order to achieve low grating strengths, an optimized grating layer is designed in terms of thickness, composition and distance from the active layer. The back facet is preferably subject to high reflecting coating (HR), in order to enhance the external quantum efficiency from the tuning section and reduce the threshold current as well.

The active section is preferably as short as 250-300 um, since the high-gain/low-loss MQW material is optimized for this device. As a whole, the total DBR array length is reduced to about 500 nm (that is half the length of a standard DBR array), thus effectively reducing the total length of the DBR wavelengths selectable array chip, this being a very crucial point to achieve a thoroughly acceptable yield for low cost solutions.

The tuneable source described herein exhibits a tuning range in excess of 40 nm in combination with good spectral behaviour (more than 40 dB SMSR) despite the longer wavelength channel detuning. The Relative Intensity Noise RIN measured for all the channels detect a RIN peak in the 15 GHz bandwidth, with results always better than −135 dB/Hz. The power output characteristics detected versus various parameters such as DBR currents and SOA injections indicate values up to +13 dBm ex facet, leading to +8 dBm in fiber, and a coupled power close to 10 dBm.

Plotting the SOA output power versus the DBR active current for a set of tuning injection values shows output power saturation, and ASE reduction, at currents greater than 50 mA (i.e. at that current the DBR output power routed into the SOA is high enough to saturate it).

This corresponds—also from the viewpoint of power consumption—to optimum DBR bias currents in the order of 50-60 mA. Additionally, the output SOA characteristics were measured for different channels, showing that 20 mW ex-facet can be achieved at 100 mA SOA current. These data also define the maximum power consumption, for 20 mW ex-facet optical output power, at less than 250 mW (worst case).

The arrangement described herein is a tuneable laser source, showing a 40 nm tuning range, +13 dBm output power ex facet, together with a limited power consumption (250 mW) and easy electronic tuning control, and very compact size. The device is based on a laser array including four SI-BH DBR lasers, monolithically integrated with a Planar Integrated Circuit (PIC), capable of routing the power to a MMI combiner and a bent waveguide SOA. The assembly includes a plurality of discrete tuneable DBR lasers disposed on a substrate and coupled to waveguides and an amplifier via an optical coupler, all integrally formed on the substrate. The assembly is tuneable over a quasi-continuous range of wavelengths depending on the peak emission, tuning range, and number of laser used.

It will of course be appreciated that, as used herein, terms such as "optical", "light", are in no way intended to be limited to visible light radiation and encompass, according to the prevailing practice in the area of optoelectronics also electromagnetic radiation in the IR and UV ranges.

It is not intended that the present invention be limited to the above embodiments and other modifications and variations are envisaged within the scope of the claims.

What I claim is:

1. A method of manufacturing a tuneable laser assembly, the assembly including:
    a substrate having formed thereon a plurality of tuneable lasers including Multi Quantum Well (MQW) active sections as well as distributed Bragg reflector (DBR) tuning sections, said lasers having respective emission wavelengths and tuning ranges such that said laser assembly can be tuned over a quasi-continuous predetermined wavelength range,
    a plurality of passive waveguides coupled to said lasers to receive therefrom said respective emission wavelengths,
    an optical coupler coupled to said waveguides to receive via said waveguides said emissions wavelengths from said lasers, and an optical amplifier having a Multi Quantum Well (MQW) active section, said amplifier coupled to said optical coupler to amplify said emission wavelengths coupled via said optical coupler, wherein the method includes the steps of:

using the same Multi-Quantum Well (MQW) material for the active sections of said tuneable lasers and said optical amplifier, and using the same bulk material for said passive waveguides, said optical coupler and said DBR tuning sections of said lasers.

2. The method of claim 1, including the steps of:

forming a MQW structure for the active sections of said lasers and said optical amplifier, achieving integration of said active sections and said bulk material for said DBR tuning sections, said passive waveguides and said optical coupler.

3. The method of claim 2, further including the step of forming after said integration said tuning sections and said passive waveguides.

4. The method of claim 1, wherein said passive waveguides include a mesa structure and the method includes the step of forming a blocking layer around said mesa structure.

5. The method of claim 4, wherein said blocking layer around said mesa structure is regrown via lateral regrowth.

6. The method of claim 1, wherein said passive waveguides include a mesa structure and the method includes the step of forming layers on the top of the said mesa by means as a final regrowth operation.

7. The method of claim 1, wherein said lasers, waveguides, optical coupler, and amplifier are integrally formed on said substrate.

8. The method of claim 1, including the step of providing said amplifier with sufficient gain to enable said assembly to output light of substantially the same intensity as output by any one of said lasers.

9. The method of claim 1, including the step of forming said optical coupler as a multimode interference coupler.

10. The method of claim 1, including the step of forming said lasers in said plurality of lasers with peak emission wavelengths and tuning ranges so as to enable said assembly to emit any wavelength selected from said predetermined quasi-continuous wavelength range.

11. The method of claim 10, wherein said predetermined quasi-continuous wavelength range covers the C transmission band.

12. The method of claim 10, wherein said predetermined quasi-continuous wavelength range is from approximately 1523 nm to 1565 nm.

13. The method of claim 1, including the steps of providing four lasers in said plurality of lasers.

14. The method of claim 13, wherein said four lasers have Bragg wavelengths at zero tuning current of 1535 nm, 1545 nm, 1555 nm and 1565 nm, respectively.

15. A method of manufacturing a tuneable laser assembly, the assembly including:

a substrate having formed thereon a plurality of tuneable lasers including Multi Quantum Well (MQW) active sections, said lasers having respective emission wavelengths and tuning ranges such that said laser assembly can be tuned over a quasi-continuous predetermined wavelength range, a plurality of waveguides coupled to said lasers to receive therefrom said respective emission wavelengths, an optical coupler coupled to said waveguides to receive via said waveguides said emissions wavelengths from said lasers, and an optical amplifier having a Multi Quantum (MQW) active section, said amplifier coupled to said optical coupler to amplify said emission wavelengths coupled via said optical coupler, wherein said lasers, waveguides, optical coupler, and optical amplifier are integrally formed on said substrate, wherein said substrate is a single substrate, wherein the method includes the step of using the same Multi-Quantum Well (MQW) material for the active sections of said tuneable lasers and said optical amplifier.

16. The method of claim 14, including the step of providing said amplifier with sufficient gain to enable said assembly to output light of substantially the same intensity as output by any one of said lasers.

17. The method of claim 14, including the step of forming said optical coupler as a multimode interference coupler.

18. The method of claim 14, including the step of forming said lasers in said plurality of lasers with peak emission wavelengths and tuning ranges so as to enable said assembly to emit any wavelength selected from said predetermined quasi-continuous wavelength range.

19. The method of claim 18, wherein said predetermined quasi-continuous wavelength range covers the C transmission band.

20. The method of claim 18, wherein said predetermined quasi-continuous wavelength range is from approximately 1523 nm to 1565 nm.

21. The method of claim 15, including the step of providing four lasers in said plurality of lasers.

22. The method of claim 21, wherein said four lasers have Bragg wavelengths at zero tuning current of 1535 nm, 1545 nm, 1555 nm and 1565 nm, respectively.

23. A method of manufacturing a tuneable laser assembly, the assembly including:

a substrate having formed thereon a plurality of tuneable lasers including distributed Bragg reflector (DBR) tuning sections, said lasers having respective emission wavelengths and tuning ranges such that said laser assembly can be tuned over a quasi-continuous predetermined wavelength range, a plurality of passive waveguides coupled to said lasers to receive therefrom said respective emission wavelengths, an optical coupler coupled to said waveguides to receive via said waveguides said emissions wavelengths from said lasers, and an optical amplifier coupled to said optical coupler to amplify said emission wavelengths coupled via said optical coupler, wherein the method comprises using the same bulk material for said passive waveguides, said optical coupler and said DBR tuning sections of said lasers.

24. The method of claim 23, wherein said common bulk material is InGaAsP.

25. The method of claim 23, including the steps of: forming a MQW active sections of said lasers and said optical amplifier, achieving integration of said active sections and said bulk material for said DBR tuning sections, said passive waveguides and said optical coupler.

26. The method of claim 25, further including the step of forming after said integration said tuning sections and said passive waveguides.

27. The method of claim 23, wherein said passive waveguides include a mesa structure and the method includes the step of forming a blocking layer around said mesa structure.

28. The method of claim 27, wherein said blocking layer around said mesa structure is regrown via lateral regrowth.

29. The method of claim 23, wherein said passive waveguides include a mesa structure and the method includes the step of forming layers on the top of the said mesa by means as a final regrowth operation.

30. The method of claim 23, wherein said lasers, waveguides, optical coupler, and amplifier are integrally formed on said substrate.

31. The method of claim 23, including the steps of providing said amplifier with sufficient gain to enable said assembly to output light of substantially the same intensity as output by any one of said lasers.

32. The method of claim 23, including the steps of forming said optical coupler as a multimode interference coupler.

33. The method of claim 23, including the step of forming said lasers in said plurality of lasers with peak emission wavelengths and tuning ranges so as to enable said assembly to emit any wavelength selected from said predetermined quasi-continuous wavelength range.

34. The method of claim 33, wherein said predetermined quasi-continuous wavelength range covers the C transmission band.

35. The method of claim 33, wherein said predetermined quasi-continuous wavelength range is from approximately 1523 nm to 1565 nm.

36. The method of claim 23, including the step of providing four lasers in said plurality of lasers.

37. The method of claim 36, wherein said four lasers have Bragg wavelengths at zero tuning current of 1535 nm, 1545 nm, 1555 nm and 1565 nm, respectively.

* * * * *

UNITED STATES PATENT AND TRADEMARK OFFICE
CERTIFICATE OF CORRECTION

PATENT NO. : 7,424,041 B2
APPLICATION NO. : 10/835080
DATED : September 9, 2008
INVENTOR(S) : Marina Meliga et al.

It is certified that error appears in the above-identified patent and that said Letters Patent is hereby corrected as shown below:

Column 8, Line 1, Claim 15, after "Quantum" insert -- Well --;

Column 8, Line 12, Claim 16, delete "14," and insert -- 15, --;

Column 8, Line 16, Claim 17, delete "14," and insert -- 15, --;

Column 8, Line 18, Claim 18, delete "14," and insert -- 15, --.

Signed and Sealed this

Twenty-third Day of November, 2010

David J. Kappos
*Director of the United States Patent and Trademark Office*